(12) United States Patent
Buijsse

(10) Patent No.: US 8,772,716 B2
(45) Date of Patent: Jul. 8, 2014

(54) PHASE PLATE FOR A TEM

(71) Applicant: FEI Company, Hillsboro, OR (US)

(72) Inventor: Bart Buijsse, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/896,103

(22) Filed: May 16, 2013

(65) Prior Publication Data

US 2013/0313428 A1     Nov. 28, 2013

Related U.S. Application Data

(60) Provisional application No. 61/650,584, filed on May 23, 2012.

(30) Foreign Application Priority Data

May 23, 2012    (EP) .................................... 12168997

(51) Int. Cl.
*G21K 7/00*    (2006.01)
*G01N 23/00*    (2006.01)

(52) U.S. Cl.
USPC ........... 250/311; 250/306; 250/307; 250/310; 250/396 R; 250/505.1

(58) Field of Classification Search
USPC .......... 250/306, 307, 310, 311, 396 R, 505.1
See application file for complete search history.

(56) References Cited

U.S. PATENT DOCUMENTS

| | | | |
|---|---|---|---|
| 6,674,078 B2* | 1/2004 | Nagayama et al. ........... 250/311 |
| 7,915,584 B2 | 3/2011 | Tiemeijer et al. |
| 7,977,633 B2 | 7/2011 | Barton et al. |
| 8,071,954 B2* | 12/2011 | Wagner et al. ............ 250/396 R |
| 8,405,027 B2 | 3/2013 | Lazar et al. |
| 2002/0011566 A1* | 1/2002 | Nagayama et al. ........... 250/311 |
| 2008/0202918 A1* | 8/2008 | Nagayama et al. ...... 204/192.11 |
| 2010/0051807 A1 | 3/2010 | Barton et al. |
| 2010/0065741 A1* | 3/2010 | Gerthsen et al. ............. 250/311 |
| 2011/0133084 A1* | 6/2011 | Nagaoki et al. ............... 250/311 |
| 2011/0315876 A1 | 12/2011 | Buijsse et al. |
| 2012/0199756 A1* | 8/2012 | Buijsse et al. ............ 250/396 R |
| 2013/0313428 A1* | 11/2013 | Buijsse ........................ 250/307 |

OTHER PUBLICATIONS

Lentzen, M., "The tuning of a Zernike phase plate with defocus and variable spherical aberration and its use in HRTEM imaging," Ultramicroscopy 99, 2004, pp. 211-220.

(Continued)

*Primary Examiner* — Michael Logie
(74) *Attorney, Agent, or Firm* — Scheinberg & Associates, PC; Michael O. Scheinberg

(57) ABSTRACT

A phase plate, specifically a Zernike type phase plate, for use in an electron microscope comprises a central hole, and a thin film causing a phase shift of the electrons passing through said film. This phase shift causes the Contrast Transfer Function (CTF) to change from a sine-like function to a cosine-like function.

The phase plate is equipped with a film in the form of an annulus, carried by a much thinner film. As a result only in a small spatial frequency range (for low frequencies) the phase is changed (and thus the CTF), and for other spatial frequencies the phase shift is negligible, and thus the CTF remains unchanged. Due to the much smaller thickness of the carrier film the scattering of electrons is negligible as well.

11 Claims, 5 Drawing Sheets

(56) References Cited

OTHER PUBLICATIONS

Nagayama, Kuniaki, "Development of phase plates for electron microscopes and their biological application," European Biophysics Journal, Apr. 2008, pp. 345-358, vol. 37 Iss. 4.

Danev, R., et al., "Design of an electron microscope phase plate using a focused continuous-wave laser," Ultramicroscopy, 2009, pp. 312-325, vol. 109.

Majorovits, E., et al., "Optimizing phase contrast in transmission electron microscopy with an electrostatic (Boersch) phase plate," Ultramicroscopy, 2007, pp. 213-226, vol. 107.

Motoki, S., et al., "200 kV TEM with a Zernike phase plate," Microsc Microanal, 2005, pp. 708-709, vol. 11, No. 2.

Nagayama, Kuniaki, et al., "Phase-plate electron microscopy: a novel imaging tool to reveal close-to-life nano-structures," Eur Biophys J., 2008, pp. 345-358, vol. 37.

Nagayama, Kuniaki, "Phase Contrast Enhancement with Phase Plates in Biological Electron Microscopy," Microscopy Today, Jul., 2010, pp. 10-13, vol. 18, Issue 4.

Danev, Radostin, et al., "Practical factors affecting the performance of a thin-film phase plate for transmission electron microscopy," Ultramicroscopy, 2009, pp. 312-325, vol. 109.

Lentzen, M., "The tuning of Zernike phase plate with defocus and variable sperical aberration and its use in HRTEM imaging," Ultramicroscopy, 2004, pp. 211-220, vol. 99.

Nagayama, Kuniaki, "Development of phase plates for electron microscopes and their biological application," Eur Biophys J, 2008, pp. 345-358, vol. 37.

* cited by examiner

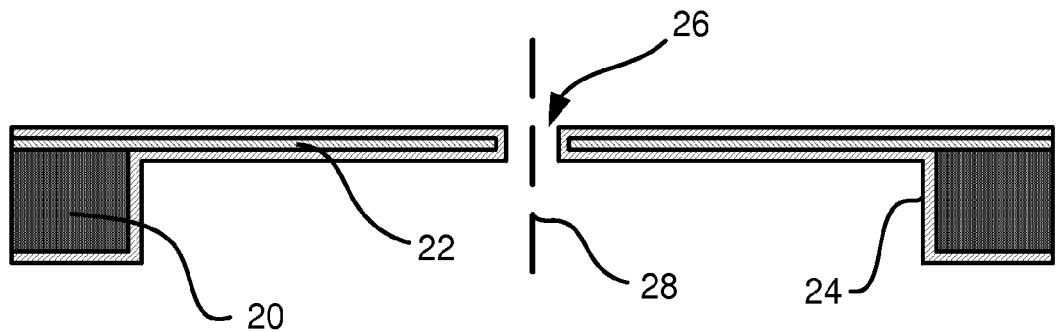
FIG. 2ª (prior art)
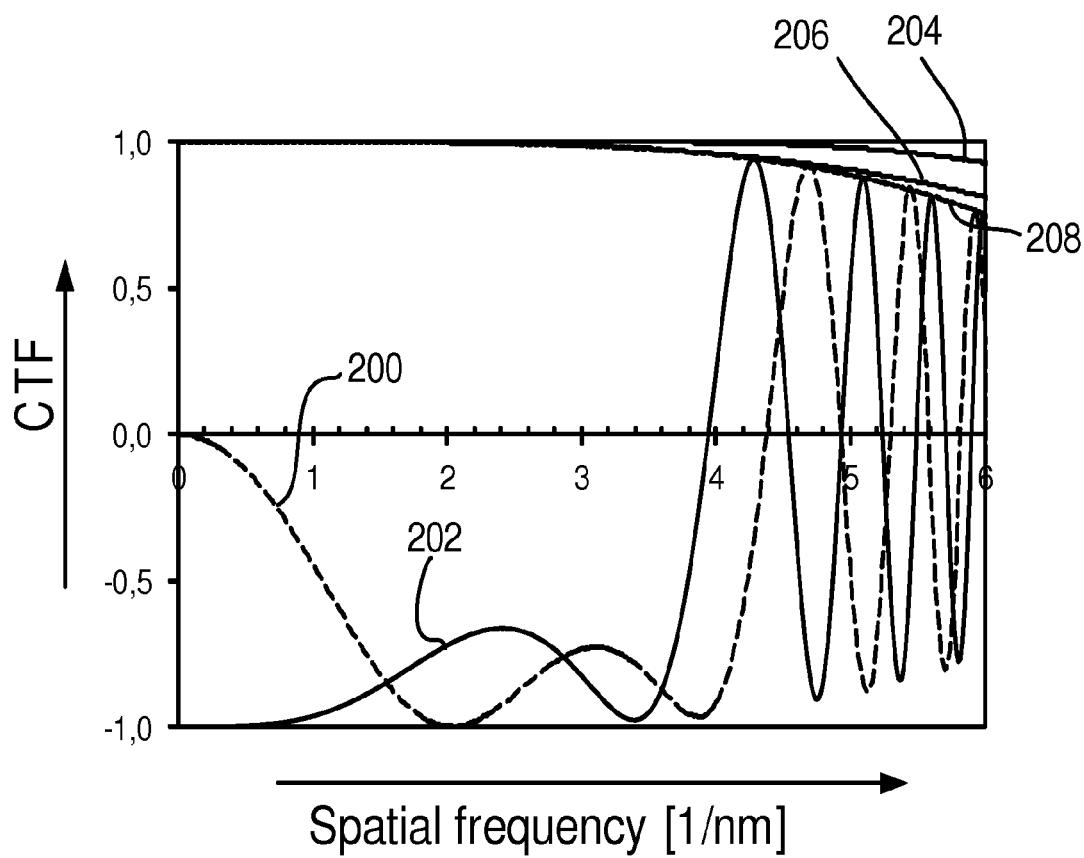
FIG. 2ᵇ (prior art)

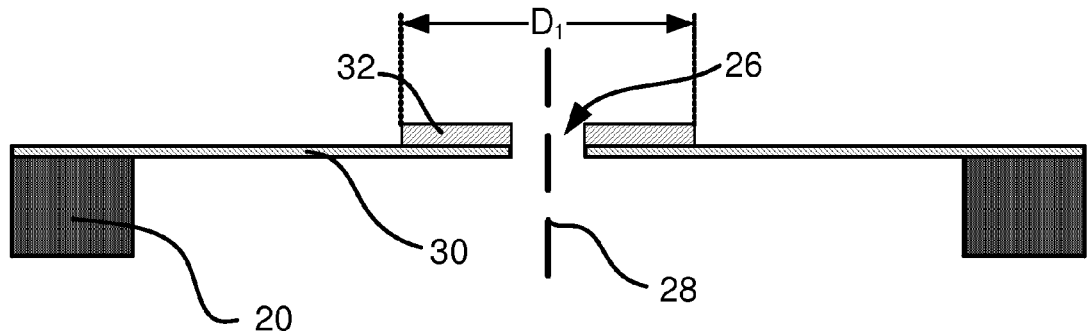
FIG. 3<sup>a</sup>
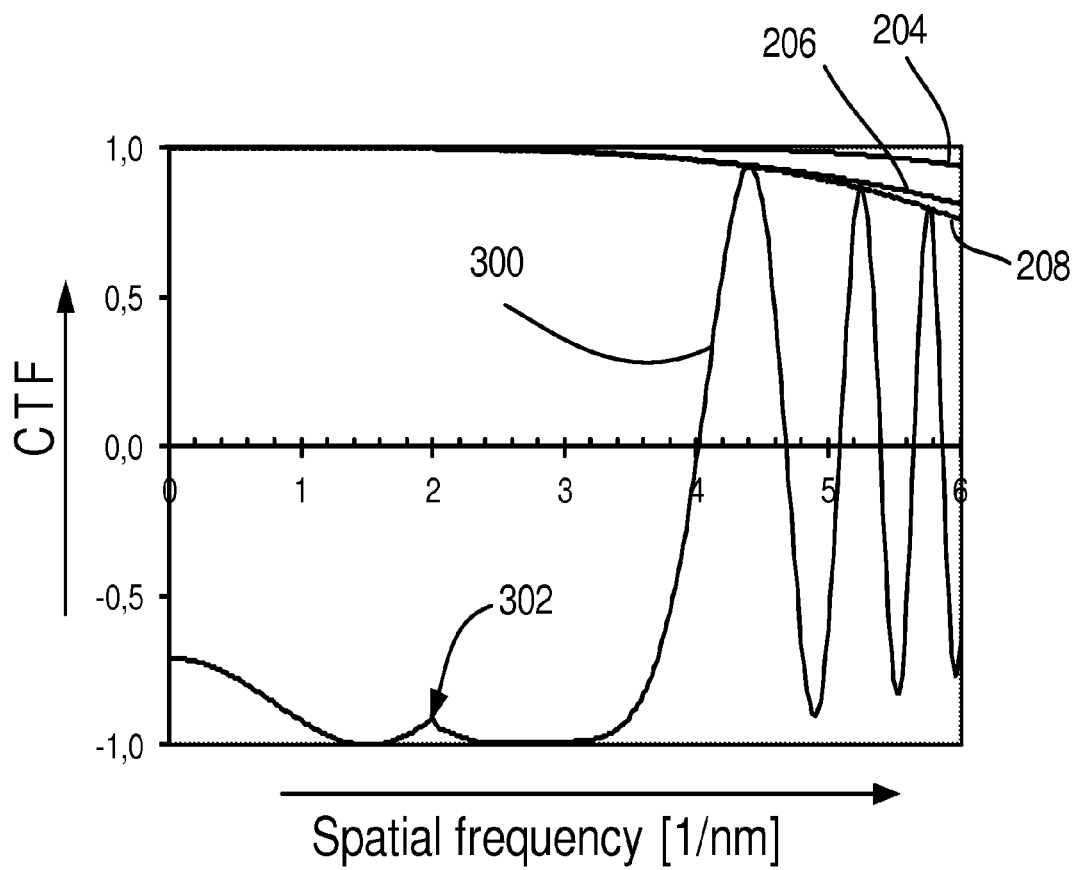
FIG. 3<sup>b</sup>

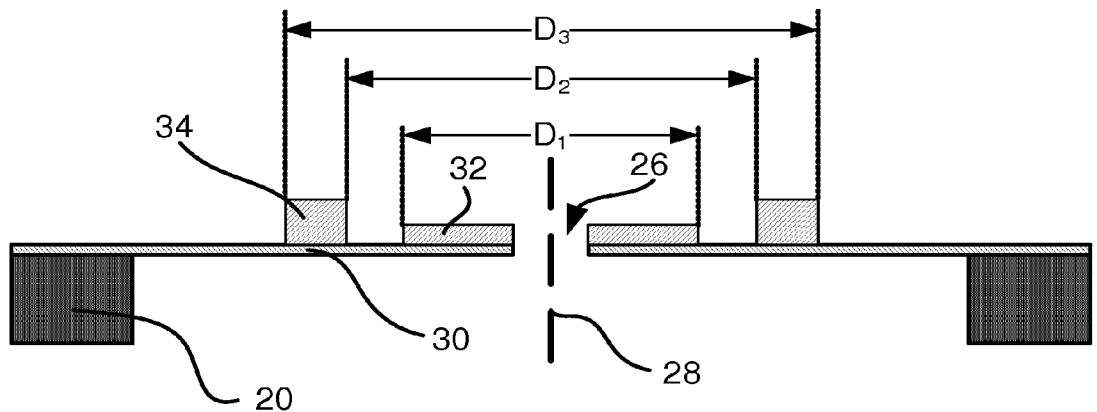
FIG. 4$^a$
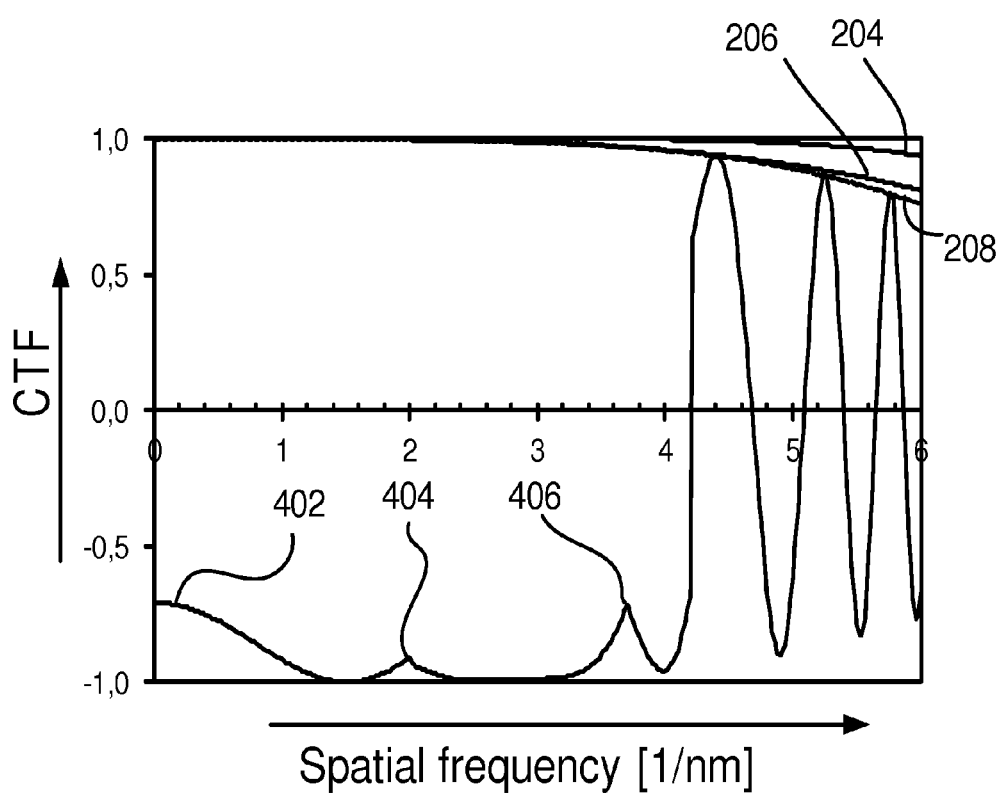
FIG. 4$^b$

PHASE PLATE FOR A TEM

This Application claims priority from U.S. Provisional Application 61/650,584, filed May 23, 2012, which is hereby incorporated by reference.

TECHNICAL FIELD OF INVENTION

The invention relates to a phase plate for an electron microscope, the microscope generating a beam of electrons, said beam of electrons passing through a sample, the beam of electrons after passing through the sample divided in an undiffracted beam and a diffracted beam, the sample imaged in an image plane where the undiffracted and the diffracted beams interfere to form an image, the phase plate placed in a plane where the undiffracted and the diffracted beam are focused, the phase plate comprising:

A central area, said central area in working causing a first phase shift,

A first thin film surrounding and bordering the central area, said first thin film in working causing a second phase shift differing from the first phase shift, A holder structure surrounding the first thin film for holding the phase plate, the difference between first phase shift and second phase shift causing an improvement of the contrast in the image for a range of spatial frequencies.

BACKGROUND OF THE INVENTION

Such a phase plate is known from "Phase Contrast Enhancement with Phase Plates in Biological Electron Microscopy", K. Nagayama et al., Microscopy Today, Vol. 18 No. 4, July 2010, pages 10-13, further referred to as Nagayama [-1-], and is also known as a Zernike phase plate.

In a Transmission Electron Microscope (TEM) a sample is imaged by passing a beam of energetic electrons with a selectable energy of, for example, between 40 keV and 400 keV, through the sample. For so-called weak-phase samples, such as biological samples, most electrons pass through the sample while some electrons are elastically or inelastically scattered, the elastically scattered electrons forming diffracted beams. The image is formed by interference of the elastically scattered and unscattered electrons (diffracted and undiffracted beams).

A problem arises in that the Contrast Transfer Function (CTF) for low spatial frequencies in the image is zero or close to zero, resulting in low visibility of large objects/structures. This is caused by the fact that a camera or fluorescent screen at the image plane is sensitive to intensity variations, but not to phase variations of the impinging electron beam.

SUMMARY OF THE INVENTION

A solution to this is the use of a phase plate, the phase plate introducing a phase difference between the diffracted beams and the undiffracted beam. There are two main types of phase plates: the so-called Zernike phase plate leaves the undiffracted beam unchanged, and causes a phase shift of the diffracted beams, while the so-called Boersch phase plate shifts the undiffracted beam while leaving the diffracted beams unchanged.

The introduction of the phase difference by the phase plate changes the sine-like behavior of the CTF to a cosine-like behavior, and thus a maximum contrast for low spatial frequencies. The invention described here relates to a Zernike phase plate as described by Nagayama [-1-], more specifically in its FIG. 5. The phase plate is positioned in the diffraction plane of the objective lens, also known as the back-focal plane of this lens. In this plane the parallel beam impinging on the sample, and the parallel diffracted beams originating from the sample, are focused into spots. The central spot in this plane is passed through a central through-hole in the phase plate, and thus experiences no phase shift. Electrons passing outside the hole pass through a foil and experience a phase shift $\phi$ of preferable $-\pi/2$. The interference of the undiffracted and the diffracted beams now results in intensity modulation instead of phase modulation.

It is noted that the phase plate as described is mounted in the diffraction plane of the TEM, but that the phase plate can be mounted in any plane downstream of the diffraction plane that is an image plane thereof.

It is further noted that the phase plate can be a coated phase plate as shown in Nagayama [-1-], FIG. 5, but that coating is not essential: as long as the electrons pass through sufficient material to experience a phase shift with respect to the electrons passing through the central area or through-hole, phase modulation is translated in intensity modulation.

It is also noted that, although a phase shift $\phi$ of $-\pi/2$ is preferred, for other phase shifts the phase modulation is at least in part translated in an intensity modulation.

A problem with the known phase plate is that part of the electrons passing through the foil are scattered by the foil and do not contribute to the image formation in the image plane of the sample. This is mentioned in e.g. "Optimizing phase contrast in transmission electron microscopy with an electrostatic (Boersch) phase plate", E. Majorovits et al., Ultramicroscopy Vol. 107 (2007), pages 213-226, further referred to as Majorowits [-2-]. At page 215, left column, it mentions as an advantage of the Boersch type phase plate over the Zernike type phase plate: "The advantage of the Boersch phase plate is obvious: no further electron scattering is introduced into the beam path, which avoids possible contamination problems and additional inelastic or plural scattering. High-resolution information is not affected and is transferred in the phase contrast image at its full signal strength."

Another problem is that, although at another spatial frequency, the CTF shows zeros, and thus spatial frequency bands with low contrast, resulting in low visibility of objects/ structures with corresponding dimensions.

The invention aims to provide at least a partial solution for one or both of these problems.

To that end a phase plate according to the invention is characterized in that between the first thin film and the holder structure at least one further thin film is present, said further thin film in working causing a further phase shift differing from the second phase shift, the difference between first phase shift and further phase shift for a further range of spatial frequencies causing an improvement of the contrast in the image compared to the situation where the further phase shift would equal the second phase shift.

The invention is based on the insight that for a first part of the CTF, corresponding to low spatial frequencies, it is beneficial to introduce a phase shift of approximately $-\pi/2$, thus changing the CTF from a sine-like behavior to a cosine-like behavior, but when for higher spatial frequencies the resulting absolute value of the CTF, |CTF|, is less than the |CTF| achieved without phase plate, it would have been better to do without this phase shift.

It is noted that the CTF can be written as $$\mathrm{CTF}(k)=A(k)E(k)\sin(\chi(k)+\phi) \qquad [1]$$

where k is the spatial frequency, A(k) is the aperture function, E(k) the attenuation of the wave for higher spatial frequencies k, also called envelope function, $\chi(k)$ a function of the aberrations of the electron optical system and $\phi$ the phase shift introduced by a phase plate (if present). The value of A(k) and E(k) are always less than unity, and thus the maximum attainable is a function of the spatial frequency k and less than one. As the maximum value of $\sin(\chi(k)+\phi)$ for a proper $\phi$ equals 1, the maximum attainable contrast transfer function is denoted by $$CTF_m(k)=A(k)E(k) \qquad [2]$$

The improved phase plate described here preferably comprises a first thin film preferably formed as a first annulus causing a second phase shift and a further thin film preferably formed as an annulus surrounding and bordering the first annular area causing a further phase shift different from the second phase shift. This enables tuning the CTF for different spatial frequencies with different phase shifts.

Preferably the CTF caused by the outer edge of the first thin film equals the CTF of the inner edge of the further thin film, thereby joining the CTF for both films without discontinuity.

In a preferred embodiment the central area of the phase plate is a through-hole.

Although strictly only a phase difference between the central, undiffracted beam and the diffracted beam is required, preferably the central beam passes through a through-hole in the film, thereby avoiding electrons from the intense central beam to impinge on the foil and cause problems like heating, contamination, charging and the like.

Preferably the first phase shift caused by the first thin film is approximately $-\pi/2$, although small deviations do not change the CTF for low spatial frequencies much: a deviation of, for example, $\pi/10$, resulting in a phase shift of $(-\pi/2\pm\pi/10)$ gives an almost identical contrast for low spatial frequencies.

Preferably the first thin film changes the |CTF| such, that $|CTF|\geq 0.5\times CTF_m$ for electrons impinging on this first thin film, whereas the |CTF| without the phase plate would be below $0.5\times CTF_m$.

Likewise the further thin film preferably causes a phase shift such that the |CTF| is kept above $0.5\times CTF_m$ for electrons impinging on this further thin film, where the phase plate described by Nagayama [-1-] would give a $|CTF_m|$ below $0.5\times CTF_m$ for said range of frequencies. More preferably the first and the further thin film should cause a phase shifts resulting in a $|CTF|\geq 0.7\times CTF_m$ for electrons impinging on these thin films.

The skilled artisan will recognize that a graphene layer or a graphene double layer is preferred as further thin layer.

Preferably the further thin film improves the |CTF| for the electrons impinging on said further thin film from a value of less than $0.5\times CTF_m(k)$ to a value in excess of $0.5\times CTF_m(k)$ for electrons impinging on this further thin film, at least at the position where first thin film and second thin film border, more specifically from a value of less than $0.7\times CTF_m(k)$ to a value of at least $0.7\times CTF_m$.

For electrons impinging further from the central beam (from the axis), the electrons fall on the thinner film, and hardly experience any phase shift or scattering. This is thus a situation that corresponds with the first maximum of the |CTF| in microscopes without a conventional phase plate. Therefore the phase plate according to the invention shows a first spatial frequency range where the sine-like function is phase shifted to a cosine-like function, and a further spatial frequency range where the CTF is (almost) identical to the CTF of a microscope without phase plate.

The phase plate according to the invention thus has an improved |CTF| over a microscope equipped with a conventional phase plate and a microscope without a phase plate. Compared to a microscope with a conventional phase plate the scattering of electrons out of the beam by the phase plate is also less, resulting in more electrons contributing to the image.

It is noted that more thin films, preferably in the form of concentric annuli, may be used. The phase shift of these annuli may differ from each other, either by using different materials or by using different thicknesses. In this way a phase plate resembling a Zone plate may be constructed, where correction of the CTF for numerous frequency intervals may be used.

It is further noted that in "Practical factors affecting the performance of a thin-film phase plate for transmission electron microscopy", Danev, R. et al, Ultramicroscopy 109 (2009), pages 312-325 [-4-], more specifically its FIG. 1, a phase plate is displayed, consisting of a thin film with a central hole. Electrons passing through the central hole will experience no phase shift, and electrons passing through the thin film a phase shift. In said publication a contamination is shown on the thin film. Locally the phase plate will thus show a phase shift different from the phase shift in the rest of the thin film. However, this contaminant does not form a concentric annulus.

BRIEF DESCRIPTION OF THE DRAWINGS

The invention is now elucidated using figures, where identical reference numerals indicate corresponding features. To that end.

FIG. $2^a$ schematically shows a prior art phase plate, and

Figure 5:
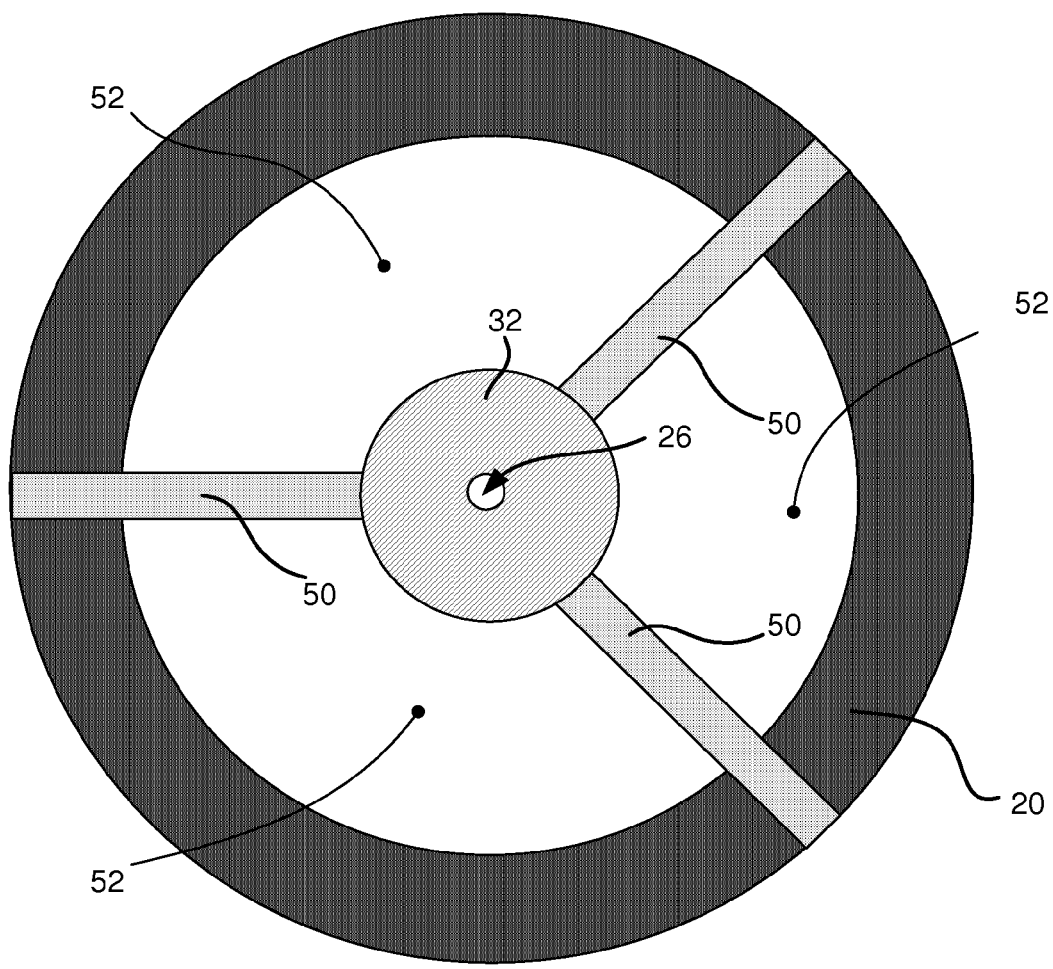

FIG. $2^b$ schematically shows the corresponding CTF, compared to the CTF of a conventional TEM without phase plate;

FIG. $3^a$ schematically shows a first embodiment of a phase plate according to the invention, and FIG. $3^b$ schematically shows the corresponding CTF;

FIG. $4^a$ schematically shows a second embodiment of a phase plate according to the invention, and FIG. $4^b$ schematically shows the corresponding CTF;

FIG. 5 schematically shows a third embodiment of a phase plate

DETAILED DESCRIPTION OF PREFERRED EMBODIMENTS

Figure 1:
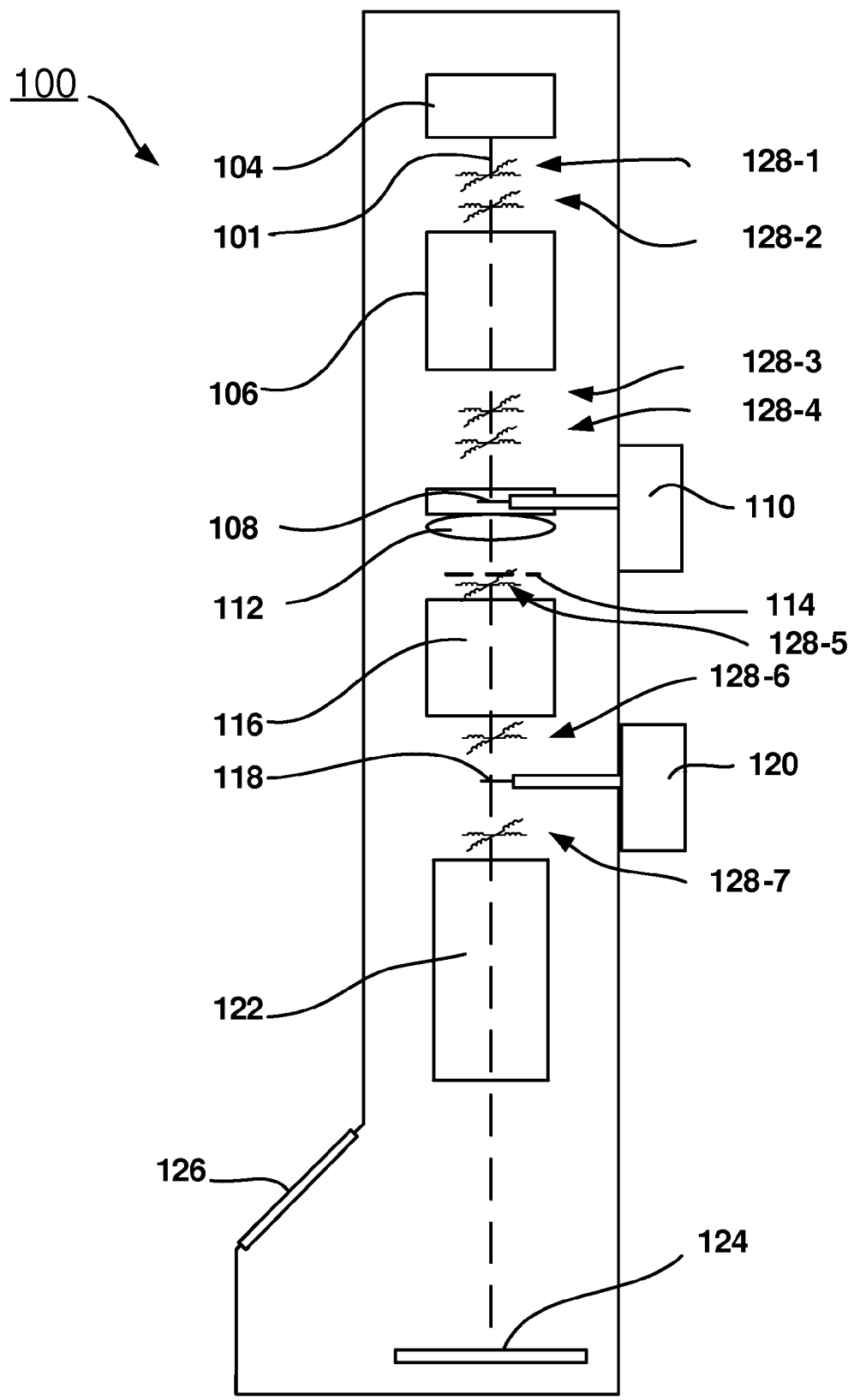
FIG. 1 schematically shows a TEM equipped with a phase plate

FIG. 1 schematically shows a TEM 100 equipped with a phase plate.

FIG. 1 shows a particle source 104 producing a beam of particles, such as electrons, along optical axis 102. The particles have a selectable energy of typically between 80-300 keV, although higher energies, e.g. 400 keV-1 MeV, or lower energies, e.g. 50 keV, may be used. The beam of particles is manipulated by condenser system 106 to form a parallel beam impinging on a sample 108, the sample positioned with a sample holder 110. The sample holder can position the sample with respect to the optical axis and may shift the sample in the plane perpendicular to the optical axis and tilt the sample with respect to said axis. Objective lens 112 forms a magnified image of the sample. The objective lens is followed by a magnifying system 116, e.g. a doublet of lenses, forming an enlarged image of the back-focal plane 114 of the objective lens. A phase plate 118 is placed in an enlarged image of the back-focal plane of the objective lens, this conjugated plane positioned between the magnifying system and a projection system 122. The magnifying system 122 thus forms an image of the back-focal plane with a variable magnification. The phase plate is positioned with a manipulator 120, allowing the phase plate to be centered round the optical axis. The projection system forms a magnified image of the sample on a detector 124, thereby revealing sample details of e.g. 0.1 nm. The detector may take the form of a fluorescent screen, or e.g. a CCD camera. In the case of e.g. a fluorescent screen the screen can be viewed via the glass window 126.

To align the optical components on the axis the TEM comprises a large number of deflectors, schematically shown as 128-1 . . . 128-7, although other deflectors on other places may be included.

It is noted that the phase plate may also be positioned in the back-focal plane itself.

FIG. 2[a] schematically shows a prior art phase plate, known from e.g. Nagayama [-1-]. It shows a holder structure 20 in the form of, for example, a standard platinum diaphragm with an aperture, as routinely used in electron microscopes. The outer diameter of such a standard platinum diaphragm is typically 3.05 mm, although other diameters are used. On this holder structure a thin foil 22 of amorphous carbon is placed. As such foils are often contaminated with charging particles or such like (not shown), one of the last fabrication steps involves covering the layer 24 with a carbon coating. The carbon coating is typically made by vacuum evaporation, resulting in an additional amorphous carbon layer.

The centre of the foil shows a through-hole 26 for passing the undiffracted beam. This hole has a diameter sufficient to pass the undiffracted beam, but preferably not much more, as then slightly scattered electrons, corresponding with electrons scattered by large structures (low spatial frequencies) do not pass through the foil to get the required phase shift but instead through the central hole. Typically the through-hole shows a diameter of less than 1 μm, formed in the foil using a focused ion beam.

The phase plate preferable shows rotational symmetry around axis 28.

The electrons passing through the carbon exhibit a phase shift as a result of the internal potential of the carbon. The relation of the thickness T of the amorphous carbon film(s) and the phase shift φ caused by passing through said film is described by Motoki [-3-]:

$$\phi = -\sigma V_{av} T \quad [1^a]$$

$$\sigma = e/(\hbar V_e) \quad [1^b]$$

where $V_{av}$ is the averaged inner potential of amorphous carbon, e is the elementary electric charge of an electron, $\hbar$ is Plank's constant and $V_e$ is the velocity of an incident electron. The averaged inner potential of amorphous carbon is 7.8 V and σ is 0.00892 (V·nm)$^{-1}$ for 300 keV electrons.

With these values, the thickness T of a carbon phase plate is calculated to be 31 nm for a phase shift φ=−π/2 (for 300 keV electrons).

It is noted that this prior art phase plate uses a round diaphragm as holder structure (support structure), but that also silicon structures (with a round or square inner or outer perimeter) are known to be used. Such a silicon phase plate can be made using lithographic techniques, optionally combined with ion beam milling for forming the central through-hole in the thin film. It is further noted that traditionally carbon is used for the thin film of prior art phase plates. However, other materials such as silicon may be used.

An overview of inner potentials and foil thicknesses for carbon, silicon and silicon nitride for different electron beam energies is given in table 1.

TABLE 1 calculated film thickness to achieve φ = −π/2 for a Zernike phase plate as a function of beam energy for different materials.

| Material | $V_{av}$ [V] | Film thickness [nm] for φ = −π/2 | | |
| --- | --- | --- | --- | --- |
| | | 100 keV | 200 keV | 300 keV |
| C | 7.8 | 21.8 | 27.6 | 30.9 |
| Si | 12.6 | 13.5 | 17.1 | 19.1 |
| SiN | 12.6 | 13.5 | 17.1 | 19.1 |

FIG. 2[b] schematically shows the CTF of the prior art Zernike phase plate shown in FIG. 2[a], compared to the CTF obtained without phase plate.

In FIG. 2[b] the CTF is shown in the so-called Scherzer defocus. The aperture function as mentioned in formula-1- is represented by curve 204, the envelope function E(k) is represented by curve 206. The product 208 of these two, the CTF$_m$(k), is typically almost identical to the envelop function. Without phase shift (without phase plate), so with φ=0, the resultant CTF is represented by the sine-like function 200. With a phase shift of −π/2 the CTF changes to the cosine-like function 202. The result is that the introduction of phase shift enables imaging large structures (low spatial frequencies). However, zero crossings will occur at higher spatial frequencies in both cases, although the zero crossings occur at different spatial frequencies.

A disadvantage of this type of phase plate is that electrons scattered by the sample must pass through the carbon film, said carbon film again scattering part of the electrons from the beam, resulting in the loss of information, and thus an increase of the signal-to-noise ratio in the image. Also, the introduction of the phase plate introduces zeros where the absolute value of the CTF without phase plate has a maximum, and at these spatial frequencies thus decreases the visibility of the corresponding structures compared to a situation where no phase plate would have been used.

It is noted that typically approximately 20% of the electrons impinging on foil 22 are scattered from the beam, and thus lost for imaging.

FIG. 3[a] schematically shows a first embodiment of a phase plate according to the invention.

The phase plate shows a similar holder structure 20 as the prior art phase plate. A thin film 30 is mounted on the holder, the thin layer having little effect on the beam. Inside diameter $D_1$ an extra layer 32 is added to the thin layer, thus forming a first thin film with added thickness, whereby the part of the phase plate inside $D_1$ resembles the prior art phase plate, showing a thin film that causes a phase shift of −π/2, but between $D_1$ and the inner perimeter of the holder the film is much thinner and the phase shift much smaller than in prior art phase plates. The result is that electrons passing through the film 32 are shifted over −π/2, but electrons passing though the phase plate outside $D_1$ are shifted much less, for example over −π/10 (for 300 keV corresponding to a carbon layer of approximately 6 nm). Therefore the CTF for these electrons resembles the CTF of a conventional microscope without phase plate, and as the film is thinner than in prior art phase plates, also the scattering by said film is less.

FIG. 3[b] shows the CTF of said phase plate. The CTF of this phase plate is given by curve 300. It shows a first region at low spatial frequencies where the CTF is modified from a sine-like behavior to a cosine-like behavior, similar to curve 202 shown in FIG. 2[b]. Following this region is a second region where it equals the CTF of a conventional microscope without phase plate, similar to curve 200 shown in FIG. 2[b]. the two regions are stitched together at point 302, corresponding with a diameter $D_1$ of the film shown in FIG. $3^a$, chosen such that the two regions show continuity.

It is noted that it is possible to have continuity in |CTF| without having continuity in CTF: this implies that the contrast changes from black/white to white/black instantaneously. This is in most cases an unwanted situation.

It is further noted that for optimum performance (read: |CTF|) it may be attractive to chose another defocus than Scherzer defocus: the intent is to have as large a region as possible where the CTF is far removed from zero.

FIG. $4^a$ shows another embodiment of the phase plate according to the invention, in which another thin film ring surrounds the further thin film.

This embodiment shows a phase plate comprising a further thin film formed as a first annulus 32 as described in the first embodiment, augmented with another annulus 34 surrounding the first annulus. The annuli 32 and 34 may have the same thickness, or different thicknesses (as shown). The result of this embodiment is that for a first range of spatial frequencies, corresponding with all electrons falling on the phase plate within diameter $D_1$ (but outside of the central hole) a first phase shift $\phi_1$ is achieved, for a second range of spatial frequencies corresponding with electrons falling on the phase plate between diameters $D_1$ and $D_2$, a phase shift $\phi_2 \approx 0$, and a third range of spatial frequencies corresponding with electrons falling on the phase plate outside diameter $D_2$, a phase shift $\phi_3$. In this way the CTF can be tuned for optimal contrast for a large range of spatial frequencies.

It is noted that the annulus 34 shown is separated from the annulus 32, but the annuli 32 and 34 may also touch each other.

As the person skilled in the art will recognize, it is possible to form a phase plate comprising a number of annuli, thus showing resemblance with a zone plate as used in e.g. x-ray optics. Also modulation of the thickness of the annulus or annuli in a discrete or non-discrete fashion is possible. However, as the CTF is also a function of the defocus, too many annuli or thickness modulation over a too large diameter may become impractical.

FIG. $4^b$ schematically shows the CTF of the phase plate shown in FIG. 4a.

It shows a first region at low frequencies, joined to a second region between the points 402 and 404, glued to yet another region from 404 to higher frequencies.

FIG. 5 shows a third embodiment of the phase plate according to the invention. In this embodiment the scattering of the further thin film is further diminished by forming the film as a number of spokes 50. The first thin film is now only partly surrounded by the further thin film, but most of the first thin film is surrounded by empty spaces 52. Electrons passing through these empty spaces are not scattered, and only part of the electrons impinging on the spokes are scattered. The phase difference of the electrons passing through the empty space and the spokes is small, and therefore the CTF of electrons falling on the spokes and those passing between the spokes is minimal. Therefore the image reconstructed by the interference of electrons in the image plane (at the detector or fluorescent screen) will be isotropic: it does not or hardly show an angular dependency in CTF caused by the phase plate.

It is noted that the scattering of electrons by the thin film does not lead to a different CTF, but in a decrease in signal-to-noise. This implies that more signal (impinging electrons) should be used to obtain an image with the same signal-to-noise. As known to the skilled artisan this may lead to damage of the sample, and thus to a lower quality of the images.

LITERATURE

[-1-] "Phase Contrast Enhancement with Phase Plates in Biological Electron Microscopy", K. Nagayama et al., Microscopy Today, Vol. 18 No. 4, July 2010, pages 10-13.

[-2-] "Optimizing phase contrast in transmission electron microscopy with an electrostatic (Boersch) phase plate", E. Majorovits et al., Ultramicroscopy Vol. 107 (2007), pages 213-226.

[-3-] "200 kV TEM with a Zernike phase plate", S. Motoki et al., Microsc. Microanal. 11 (Suppl 2), 2005, pages 708-709.

[-4-] "Practical factors affecting the performance of a thin-film phase plate for transmission electron microscopy", Danev, R. et al, Ultramicroscopy 109 (2009), pages 312-325.

The invention claimed is:

1. A phase plate suitable for an electron microscope, the microscope adapted to generate a beam of electrons, said beam of electrons in working passing through a sample, said beam of electrons in working, after passing through the sample, divided in an undiffracted beam and a diffracted beam, the sample in working imaged in an image plane where the undiffracted and the diffracted beams in working interfere to form an image, the phase plate placed in a plane where the undiffracted and the diffracted beam in working are focused, the phase plate comprising:

a central area, said central area in working causing a first phase shift of electrons, a first thin film surrounding and bordering the central area, said first thin film in working causing a second phase shift of electrons differing from the first phase shift, a holder structure surrounding the first thin film suitable for holding the phase plate, the difference between first phase shift and second phase shift in working causing an improvement of the contrast in the image for a range of spatial frequencies, wherein between the first thin film and the holder structure at least one further thin film is present, said further thin film in working causing a further phase shift of electrons differing from the second phase shift, the difference between first phase shift and further phase shift for a further range of spatial frequencies in working causing an improvement of the contrast in the image compared to the situation where the further phase shift would equal the second phase shift the first thin film and the further thin film are formed as concentric annuli, the annulus forming the further thin film surrounding and bordering the annulus forming the first thin film, the centre of the annuli coinciding with the middle of the central area.

2. The phase plate of claim 1 in which the central area is a through-hole, and the first phase shift thus equals zero.

3. The phase plate of claim 1 in which the first thin film in working causes a phase shift such, that the absolute value of the Contrast Transfer Function, |CTF| of the corresponding frequency range is changed from a value of at most 0.5 of the maximum attainable CTF to a value of at least 0.5 of the maximum attainable CTF, more specifically from a value of less than 0.7 of the maximum attainable CTF to a value of at least 0.7 of the maximum attainable CTF.

4. The phase plate of claim 1 in which the further thin film in working causes the further phase shift such, that in said further range of spatial frequencies |CTF| of the corresponding frequency range is changed from a value of at most 0.5 of the maximum attainable CTF to a value of at least 0.5 of the maximum attainable CTF, more specifically from a value of less than 0.7 of the maximum attainable CTF to a value of at least 0.7 of the maximum attainable CTF.

5. The phase plate of claim 1 in which the further thin layer is a graphene layer or a graphene double-layer.

6. The phase plate of claim 1 in which the thickness of at least one of the thin films is modulated as a function of the distance from the center in such a way that in working the resultant absolute value of the ICTFI is for the corresponding frequency range above 0.5 of the maximum attainable CTF, more specifically more than 0.7 of the maximum attainable CTF, most specifically more than 0.9 of the maximum attainable CTF.

7. The phase plate of claim 6 in which the CTF in working does not change sign for the frequency corresponding to the outer edge of the first thin film and the inner edge of the further thin film.

8. The phase plate of claim 1 in which the first thin film and the further film show a difference in thickness, as a result of which in working the phase shift caused by the first thin film and the further thin film differ.

9. The phase plate of claim 1 in which the first thin film and the further thin film show materials with different averaged internal potentials, as a result of which in working the phase shift caused by the first thin film and the further thin film differ.

10. The phase plate of claim 1 in which the further thin film shows openings, the first thin layer connected to the holder structure by spokes dividing the openings.

11. An electron microscope, comprising: a source of electrons;
 an objective lens for focusing the electrons;
 the phase plate in accordance with claim 1;
 an imaging device for forming an image from the electrons.

\* \* \* \* \*